US009780056B1

United States Patent
Lu et al.

(10) Patent No.: US 9,780,056 B1
(45) Date of Patent: Oct. 3, 2017

(54) SOLDER BALL, MANUFACTURING METHOD THEREOF, AND SEMICONDUCTOR DEVICE

(71) Applicant: ChipMOS Technologies Inc., Hsinchu (TW)

(72) Inventors: Tung-Bao Lu, Hsinchu (TW); Tzu-Han Hsu, Hsinchu (TW)

(73) Assignee: ChipMOS Technologies Inc., Hsinchu (TW)

( * ) Notice: Subject to any disclaimer, the term of this patent is extended or adjusted under 35 U.S.C. 154(b) by 0 days.

(21) Appl. No.: 15/297,158

(22) Filed: Oct. 19, 2016

(30) Foreign Application Priority Data

Apr. 29, 2016 (TW) .............................. 105113385 A

(51) Int. Cl.
*H01L 23/00* (2006.01)
(52) U.S. Cl.
CPC .............. *H01L 24/13* (2013.01); *H01L 24/11* (2013.01); *H01L 24/16* (2013.01); *H01L 2224/11418* (2013.01); *H01L 2224/11462* (2013.01); *H01L 2224/13014* (2013.01); *H01L 2224/13016* (2013.01); *H01L 2224/13139* (2013.01); *H01L 2224/13541* (2013.01); *H01L 2224/13611* (2013.01); *H01L 2224/13639* (2013.01); *H01L 2224/16145* (2013.01); *H01L 2224/16227* (2013.01); *H01L 2924/2064* (2013.01); *H01L 2924/2076* (2013.01); *H01L 2924/20753* (2013.01); *H01L 2924/20754* (2013.01); *H01L 2924/20755* (2013.01); *H01L 2924/20756* (2013.01); *H01L 2924/20757* (2013.01); *H01L 2924/20758* (2013.01); *H01L 2924/20759* (2013.01)

(58) Field of Classification Search
CPC ........... H01L 24/13; H01L 24/11; H01L 24/16
See application file for complete search history.

(56) References Cited

U.S. PATENT DOCUMENTS

| 7,615,476 B2 * | 11/2009 | Hua ..................... H01L 21/4846 257/E21.508 |
| 7,755,200 B2 * | 7/2010 | Nguyen ................ B23K 3/0623 257/738 |
| 8,920,934 B2 * | 12/2014 | Jiang .................. H01L 23/49816 257/772 |
| 9,266,196 B2 * | 2/2016 | Akagawa ................ B23K 35/00 |
| 9,404,194 B2 * | 8/2016 | Mayer ...................... C25D 21/12 |
| 9,437,566 B2 * | 9/2016 | Katkar ..................... H01L 24/14 |
| 9,475,145 B2 * | 10/2016 | Yang ..................... B23K 1/0016 |
| 2007/0023910 A1 * | 2/2007 | Beddingfield .... H01L 23/49816 257/738 |
| 2015/0255414 A1 * | 9/2015 | Liu .......................... H01L 24/16 257/737 |

FOREIGN PATENT DOCUMENTS

TW          200632133          9/2006

OTHER PUBLICATIONS

"Office Action of Taiwan Counterpart Application," dated Jan. 12, 2017, p. 1-p. 6.

* cited by examiner

*Primary Examiner* — William Coleman
(74) *Attorney, Agent, or Firm* — Jianq Chyun IP Office

(57) ABSTRACT

A solder ball includes a silver ball structure and a shell structure. The shell structure wraps a surface of the silver ball structure, and a material of the shell structure at least includes tin. When the solder ball is bonded to other devices, the ball height of the solder ball remains constant to avoid collapse.

17 Claims, 2 Drawing Sheets

SOLDER BALL, MANUFACTURING METHOD THEREOF, AND SEMICONDUCTOR DEVICE

CROSS-REFERENCE TO RELATED APPLICATION

This application claims the priority benefit of Taiwan application serial no. 105113385, filed on Apr. 29, 2016. The entirety of the above-mentioned patent application is hereby incorporated by reference herein and made a part of this specification.

TECHNICAL FIELD

The disclosure relates to a solder ball, a manufacturing method thereof, and a semiconductor device; more particularly, the disclosure relates to a solder ball with a silver ball structure, a manufacturing method of the solder ball, and a semiconductor device.

DESCRIPTION OF RELATED ART

With the progress of the science and technology, various electronic products have been developed to have high speed, great performance, light weight, and compact size, and this development has led to the miniaturization of the semiconductor package.

In recent years, flip chip (FC) bonding technology has been playing an important role in the filed of semiconductor package. The FC bonding technology is a package technology of bonding a chip to a carrier. Specifically, plural solder pads are arranged on an active surface of the chip, and bumps are formed on the solder pads. The chip is then flipped, and the solder pads on the chip are electrically connected to contacts on the carrier through the bumps respectively, such that the chip can be electrically connected to the carrier through the bumps and then electrically connected to an external electronic apparatus through internal circuit of the carrier.

In general, the bumps or the solder balls are often made of tin. However, after a reflow process is performed, it is likely for the tin-containing bumps with the low melting point to collapse, such that the distance between the chip and the carrier is shortened or cannot remain constant. What is more, if the tin-containing bumps collapse to an excessive degree, the adjacent bumps or solder balls are apt to be bridged; thereby, the issue of short circuit may occur, and the package yield may be lessened.

SUMMARY

The disclosure provides a solder ball, a manufacturing method thereof, and a semiconductor device, and the ball height of the solder ball remains constant.

In an embodiment of the disclosure, a solder ball that includes a silver ball structure and a shell structure is provided. The shell structure wraps a surface of the silver ball structure, and a material of the shell structure at least includes tin.

According to an embodiment of the disclosure, a material of the shell structure includes tin or tin-silver alloy containing 2.5% of silver.

According to an embodiment of the disclosure, a diameter of the silver ball structure is between 30 μm and 100 μm. A thickness of the shell structure is between 10 μm and 30 μm.

A sum of the diameter of the silver ball structure and the thickness of the shell structure is between 50 μm and 160 μm.

According to an embodiment of the disclosure, a melting point of the silver ball structure is higher than a melting point of the shell structure.

According to an embodiment of the disclosure, hardness of the silver ball structure is greater than hardness of the shell structure.

In an embodiment of the disclosure, a manufacturing method of a solder ball includes following steps. A silver raw material is transformed into a plurality of silver ball structures through spray granulation. A plurality of shell structures are formed through barrel plating, and the shell structures respectively wrap surfaces of the silver ball structures. A material of the shell structures at least includes tin.

According to an embodiment of the disclosure, a material of the shell structures includes tin or tin-silver alloy containing 2.5% of silver.

In an embodiment of the disclosure, a semiconductor device that includes a first carrier and a plurality of solder balls is provided. The first carrier has a plurality of solder pads. The solder balls are respectively arranged on the solder pads of the first carrier. The solder balls are electrically connected to the solder pads respectively.

According to an embodiment of the disclosure, the shell structures of the solder balls are respectively bonded to the solder pads.

According to an embodiment of the disclosure, the semiconductor device further includes a second carrier arranged on the first carrier. The second carrier is electrically connected to the first carrier through the solder balls.

In view of the above, the first carrier and the second carrier are electrically connected through the solder balls having the silver ball structures. Compared to the conventional tin-containing bumps, the silver ball structures provided herein can have constant ball height to avoid collapse. In addition, the silver ball structures provided herein have favorable conductivity, and thus the performance of the semiconductor device can be enhanced. Besides, the surfaces of the silver ball structures are wrapped by the tin-containing shell structures; hence, compared to the single silver ball structure, the silver ball provided herein is also conducive to the reduction of the reflow temperature.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the invention.

DETAILED DESCRIPTION OF DISCLOSED EMBODIMENTS

Figure 1:
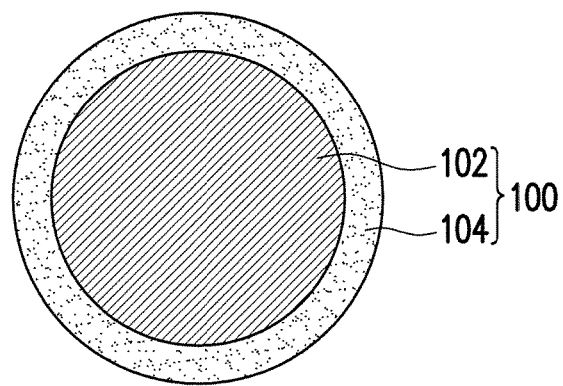
FIG. 1 is a schematic cross-sectional diagram illustrating a solder ball according to an embodiment of the disclosure.

The disclosure will now be described with reference to the accompanying drawings, in which exemplary embodiments provided in the disclosure are shown. Note that the disclosure can be accomplished in many different ways and should not be limited to the embodiments set forth herein. The thickness of layers and regions shown in the drawings may be enlarged for clear illustration. Identical or similar reference numbers represent the identical or similar devices, and thus these identical or similar devices will not be elaborated in each paragraph below.

FIG. 1 is a schematic cross-sectional diagram illustrating a solder ball according to an embodiment of the disclosure.

With reference to FIG. 1, the solder ball 100 provided in the present embodiment includes a silver ball structure 102 and a shell structure 104 wrapping a surface of the silver ball structure 102. Particularly, a manufacturing method of the solder ball 100 includes following steps.

A silver raw material is transformed into a plurality of the silver ball structures 102 through spray granulation. In an embodiment of the disclosure, the silver ball structures 102 may be solid ball structures or solid ball-like structures, and a material of the silver ball structures 102 includes fine silver. However, the disclosure is not limited thereto; in other embodiments, the material of the silver ball structures 102 may be silver alloy, and a proportion of silver to other metals can be adjusted according to actual demands. A diameter of each silver ball structure 102 may be between 30 μm and 100 μm.

A plurality of shell structures 104 are then formed through barrel plating. Barrel plating is a plating process; specifically, the silver ball structures 102 may be placed into a reserved barrel, and the shell structures 104 are deposited onto the surfaces of the silver ball structures 102 during the rotation of the barrel. The more the barrel rotates, the greater the evenness of the shell structures 104 which are plated onto the surfaces of the silver ball structures. Hence, the shell structures 104 can completely wrap the surfaces of the silver ball structures 102. In an embodiment of the disclosure, a material of the shell structures 104 may include tin or tin-silver alloy containing 2.5% of silver. A diameter of each shell structure 104 may be between 10 μm and 30 μm. The diameter of the entire solder ball 100, i.e., the sum of the diameter of the silver ball structure 102 and the thickness of the shell structure 104 may be between 50 μm and 160 μm. However, the disclosure is not limited thereto; in other embodiments, the diameter of each silver ball structure 102, the thickness of each shell structure 104, and the diameter of the entire solder ball 100 can be adjusted according to actual demands.

Figure 2:
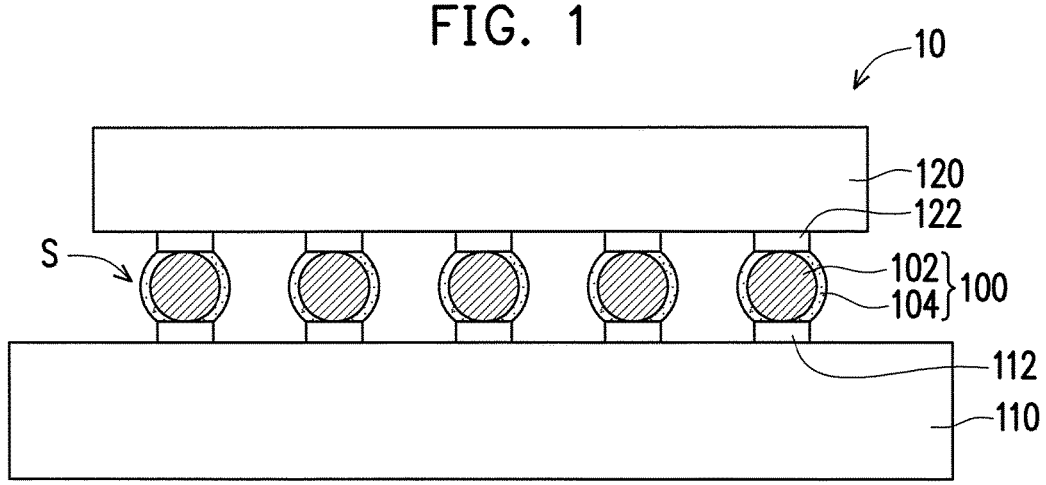
FIG. 2 is a schematic cross-sectional diagram illustrating a semiconductor device according to a first embodiment of the disclosure.

FIG. 2 is a schematic cross-sectional diagram illustrating a semiconductor device according to a first embodiment of the disclosure.

With reference to FIG. 2, in the first embodiment, a semiconductor device 10 having a first carrier 110, a second carrier 120, and a plurality of solder balls 100 is provided. The first carrier 110 has a plurality of solder pads 112, and the second carrier 120 has a plurality of solder pads 122. The solder balls 100 are respectively arranged between the solder pads 112 of the first carrier 110 and the solder pads 122 of the second carrier 120. The solder balls 100 can be electrically connected to the first carrier 110 and the second carrier 120. In an embodiment of the disclosure, the first carrier 110 may be a die, a chip, a wafer, a semiconductor substrate, a circuit board, or a combination thereof, for instance. Similarly, the second carrier 120 may also be a die, a chip, a wafer, a semiconductor substrate, a circuit board, or a combination thereof, for instance. The size, the function, or the structure of the first carrier 110 may be the same as that of the second carrier 120. For instance, the first carrier 110 and the second carrier 120 may have the same size and are stacked through the solder balls 100 to form a stacked chip structure. However, the disclosure is not limited thereto; in other embodiments, the size, the function, or the structure of the first carrier 110 may be different from that of the second carrier 120. For instance, the first carrier 110 may be a circuit board, and the second carrier 120 may be a semiconductor chip, for instance, and the first carrier 110 and the second carrier 120 are constituted as a flip chip structure. In another embodiment, the first carrier 110 may be a wafer, and the second carrier 120 may be a semiconductor chip. The semiconductor chip is electrically connected to the circuit board through the solder balls 100 and then electrically connected to an external circuit through the circuit board.

Specifically, in the present embodiment, a manufacturing method of the semiconductor device 10 is described below. The solder balls 100 are respectively arranged on the solder pads 112 of the first carrier 110 through ball placement. A first reflow process is performed to bond the solder balls 100 to the solder pads 112 of the first carrier 110. The second carrier 120 is flipped, such that the solder pads 122 of the second carrier 120 respectively correspond to the solder balls 100. A second reflow process is performed to bond the shell structures 104 of the solder balls 100 to the solder pads 112 and 122 respectively. After the second reflow process is performed, the sidewall S or the surface S of each of the shell structures 104 may be protruding from the center of each of the solder balls 100 toward the surface of each of the solder balls 100. Besides, the silver solder balls 102 may be in direct contact with the solder pads 112 and 122. That is, the silver ball structures 102 are directly electrically connected to the solder pads 112 and 122 (not through the shell structures 104), so as to improve the conductivity between the solder balls 100 and the first carrier 110, and between the solder balls 100 and the second carrier 120.

In the present embodiment, note that a melting point of the silver ball structures 102 is higher than a melting point of the shell structures 104, and the hardness of the silver ball structures 102 is greater than the hardness of the shell structures 104. Hence, when the reflow temperature reaches the melting point of the shell structures 104, the shell structures 104 are melted first, so as to achieve the bonding effects. At this time, the silver ball structures 102 remain in the solid state, and the hardness of the silver ball structures 102 remains constant. Namely, the solder balls 100 provided herein has constant ball height. In addition, after the second carrier 120 is flipped, the solder balls 100 having the constant ball height do not collapse. Moreover, compared to the conventional tin-containing bumps, the silver ball structures 102 provided in the present embodiment have favorable conductivity. Therefore, the solder balls 100 having the silver ball structures 102 are used for an electrical connection between the first carrier 110 and the second carrier 120, so as to enhance the overall performance of the semiconductor device 10.

Figure 3:
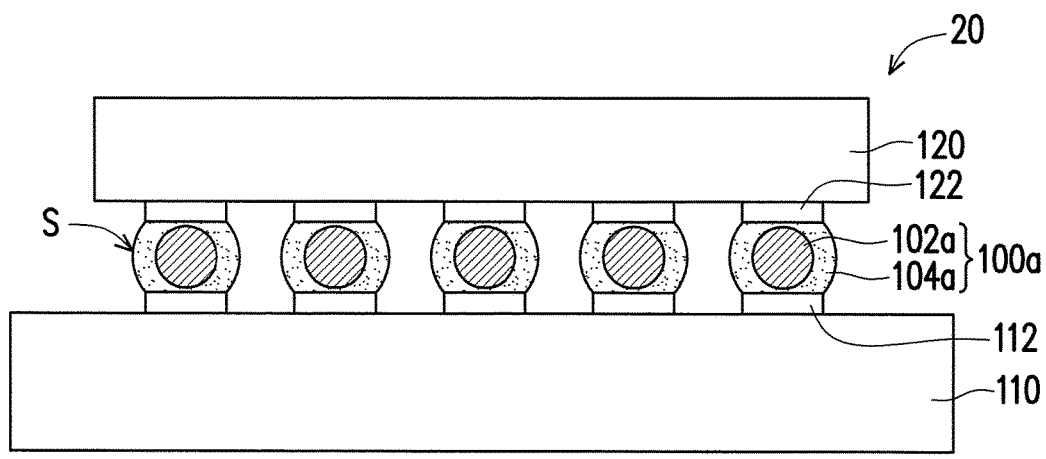
FIG. 3 is a schematic cross-sectional diagram illustrating a semiconductor device according to a second embodiment of the disclosure.

FIG. 3 is a schematic cross-sectional diagram illustrating a semiconductor device according to a second embodiment of the disclosure.

With reference to FIG. 3, in the second embodiment, another semiconductor device 20 is provided. The structure and the manufacturing method of the semiconductor device 20 provided in the second embodiment are similar to those of the semiconductor device 10 provided in the first embodiment. The difference between the semiconductor device 20 and the semiconductor device 10 is that the silver ball structures 102a of the solder balls 100a provided in the second embodiment are not in direct contact with the solder pads 112 and 122. Specifically, parts of the shell structures 104a are left between the silver ball structures 102a and the solder pads 112 and 122, such that the silver ball structures 102a are electrically connected to the solder pads 112 and 122 through the parts of the shell structures 104a. It can be learned from FIG. 2 and FIG. 3 that the proportions of the silver ball structures and the shell structures can be adjusted according to actual demands, so as to form the semiconductor devices with different structures (the silver ball structures are in direct contact or not in direct contact with the solder pads).

Figure 4:
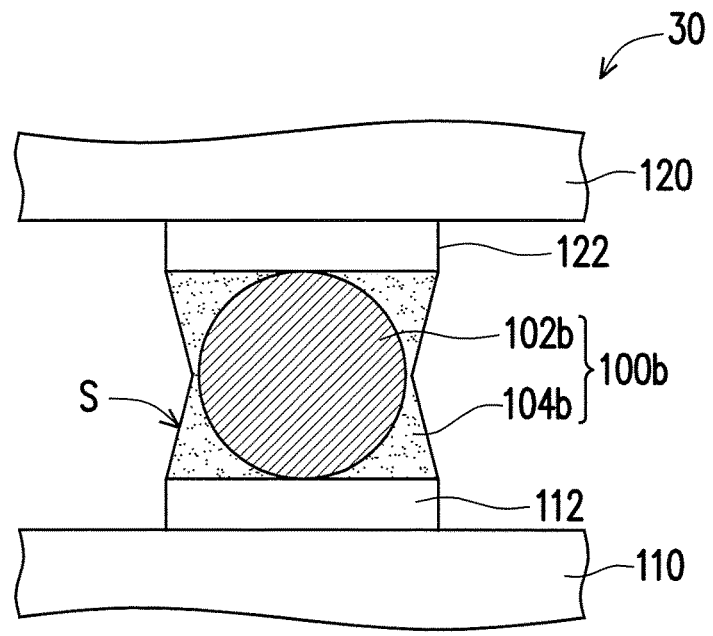
FIG. 4 is a schematic cross-sectional diagram illustrating a semiconductor device according to a third embodiment of the disclosure.

FIG. 4 is a schematic cross-sectional diagram illustrating a semiconductor device according to a third embodiment of the disclosure. To simplify and enlarge the illustration, one solder ball 100b is depicted in FIG. 4, which should however not be construed as a limitation in the disclosure; in other embodiments, the number of solder balls 100b may be adjusted according to actual demands.

With reference to FIG. 4, in the third embodiment, still another semiconductor device 30 is provided. The structure and the manufacturing method of the semiconductor device 30 provided in the third embodiment are similar to those of the semiconductor device 10 provided in the first embodiment. The difference between the semiconductor device 30 and the semiconductor device 10 is that the sidewall S or the surface S of the solder ball 100b is recessed from the surface of the solder ball 100b toward the center of the solder ball 100b; by contrast, the sidewall S or the surface S of the solder ball 100 in the first embodiment is protruding. From another perspective, the cross-sectional profile of the solder ball 100b may also be shaped as a sandglass, for instance. However, the disclosure is not limited thereto. Since the surface tension between the shell structures and the solder pads may be changed, the sidewall or the surface of the solder ball may be shaped in a different manner. In other embodiments of the disclosure, the sidewall or the surface of the solder ball may have a linear shape, i.e., the cross-sectional profile of the solder ball may be rectangular. Although the sidewall S or the surface S of the solder ball 100b shown in FIG. 4 is a V-shaped recess, the sidewall S or the surface S of the solder ball 100b may also be a U-shaped recess.

Figure 5:
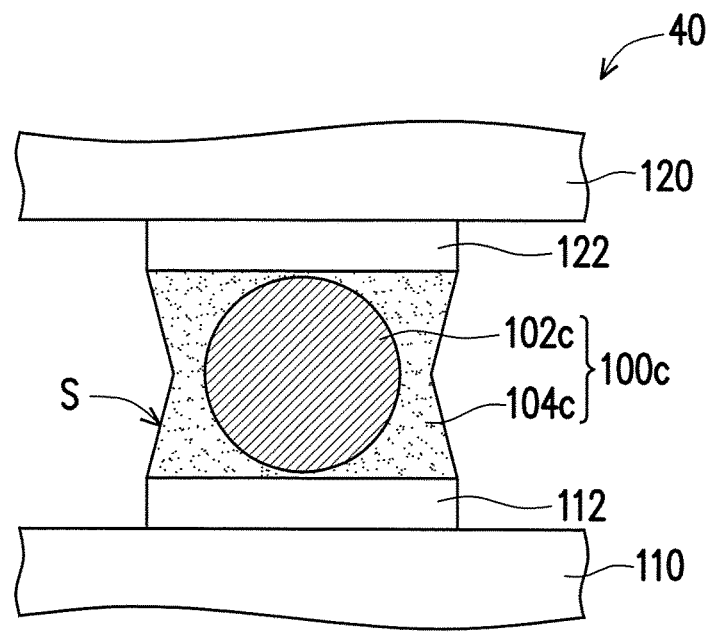
FIG. 5 is a schematic cross-sectional diagram illustrating a semiconductor device according to a fourth embodiment of the disclosure.

FIG. 5 is a schematic cross-sectional diagram illustrating a semiconductor device according to a fourth embodiment of the disclosure.

With reference to FIG. 5, in the fourth embodiment, still another semiconductor device 40 is provided. The structure and the manufacturing method of the semiconductor device 40 provided in the second embodiment are similar to those of the semiconductor device 30 provided in the third embodiment. The difference between the semiconductor device 40 and the semiconductor device 30 is that the silver ball structure 102c provided in the fourth embodiment are not in direct contact with the solder pads 112 and 122, and that parts of the shell structure 104c are still left between the silver ball structure 102c and the solder pads 112 and 122.

As provided in FIG. 2 to FIG. 5, regardless of whether the silver ball structures are in direct contact with the solder pads, as long as the silver ball structures have the constant ball height and do not collapse, the resultant semiconductor device falls within the scope of protection provided herein.

To sum up, the first carrier and the second carrier are electrically connected through the solder balls having the silver ball structures. Compared to the conventional tin-containing bumps, the silver ball structures provided herein can have constant ball height to avoid collapse. In addition, the silver ball structures provided herein have favorable conductivity, and thus the performance of the semiconductor device can be enhanced. Besides, the surfaces of the silver ball structures are wrapped by the tin-containing shell structures; hence, compared to the single silver ball structure, the silver ball provided herein is also conducive to the reduction of the reflow temperature.

Although the disclosure has been provided with reference to the above embodiments, it will be apparent to one of ordinary skill in the art that modifications to the described embodiments may be made without departing from the spirit of the disclosure. Accordingly, the scope of the disclosure will be defined by the attached claims and not by the above detailed descriptions.

What is claimed is:

1. A solder ball comprising:
 a silver ball structure; and
 a shell structure wrapping a surface of the silver ball structure, wherein the shell structure is constituted of tin-silver alloy containing 2.5% of silver.

2. The solder ball of claim 1, wherein a diameter of the silver ball structure is between 30 μm and 100 μm.

3. The solder ball of claim 1, wherein a thickness of the shell structure is between 10 μm and 30 μm.

4. The solder ball of claim 1, wherein a sum of a diameter of the silver ball structure and a thickness of the shell structure is between 50 μm and 160 μm.

5. The solder ball of claim 1, wherein a melting point of the silver ball structure is higher than a melting point of the shell structure.

6. The solder ball of claim 1, wherein hardness of the silver ball structure is greater than hardness of the shell structure.

7. A semiconductor device comprising:
 a first carrier having a plurality of solder pads; and
 a plurality of the solder balls of claim 1, the solder balls being respectively arranged on the solder pads of the first carrier, wherein the solder balls are electrically connected to the solder pads respectively.

8. The semiconductor device of claim 7, wherein the shell structures of the solder balls are respectively bonded to the solder pads.

9. The semiconductor device of claim 7, further comprising a second carrier arranged on the first carrier, wherein the second carrier is electrically connected to the first carrier through the solder balls.

10. The semiconductor device of claim 9, wherein a sidewall of each shell structure is protruded from a center of a respective solder ball toward a surface of the respective solder ball.

11. The semiconductor device of claim 9, wherein a sidewall of each shell structure is recessed from a center of a respective solder ball toward a surface of the respective solder ball.

12. The semiconductor device of claim 9, wherein the silver ball structure of each solder ball is in direct contact with a respective solder pad.

13. The semiconductor device of claim 9, wherein the silver ball structure of each solder ball is not in direct contact with a respective solder pad.

14. A manufacturing method of a solder ball, comprising:
- transforming a silver raw material into a plurality of silver ball structures through spray granulation; and
- forming a plurality of shell structures through barrel plating, the shell structures respectively wrapping surfaces of the silver ball structures, wherein the shell structures are constituted of tin-silver alloy containing 2.5% of silver.

15. The manufacturing method of claim 14, wherein a diameter of each silver ball structure is between 30 μm and 100 μm.

16. The manufacturing method of claim 14, wherein a thickness of each shell structure is between 10 μm and 30 μm.

17. The manufacturing method of claim 14, wherein a sum of a diameter of each silver ball structure and a thickness of each shell structure is between 50 μm and 160 μm.

* * * * *